United States Patent [19]

Carp et al.

[11] Patent Number: 4,978,931
[45] Date of Patent: Dec. 18, 1990

[54] TUNABLE PHASE SHIFTER HAVING WIDE INSTANTANEOUS BANDWIDTH

[75] Inventors: Stuart L. Carp, Menlo Park; Allen P. Edwards, Palo Alto, both of Calif.

[73] Assignee: Hewlett-Packard Company, Palo Alto, Calif.

[21] Appl. No.: 363,247

[22] Filed: Jun. 8, 1989

[51] Int. Cl.$^5$ ............................................. H03H 5/00
[52] U.S. Cl. .................................... 333/28 R; 333/139
[58] Field of Search ...................... 333/28 R, 138–140, 333/117, 118, 164

[56] References Cited

U.S. PATENT DOCUMENTS

| | | | |
|---|---|---|---|
| 3,605,031 | 9/1971 | Tongue | 333/118 X |
| 3,621,480 | 11/1971 | Brownlie | 333/118 X |
| 3,906,409 | 9/1975 | Whitehouse | 333/138 |
| 4,205,282 | 5/1980 | Gipprizh | 333/164 X |
| 4,288,763 | 9/1981 | Hopfer | 333/164 |
| 4,764,740 | 8/1988 | Meyer | 333/139 X |
| 4,823,096 | 4/1989 | Hash | 333/117 X |
| 4,859,972 | 8/1989 | Franke et al. | 333/164 |

FOREIGN PATENT DOCUMENTS

| | | | |
|---|---|---|---|
| 2411171 | 9/1975 | Fed. Rep. of Germany | 333/164 |
| 0083314 | 6/1980 | Japan | 333/164 |
| 0243401 | 10/1987 | Japan | 333/164 |

OTHER PUBLICATIONS

Shiki et al., "If Variable Equalizers for FM Microwave Radio Links", IEEE Trans. on Circuits and System, vol. CAS-21, No. 4, Jul. 1974, pp. 517–527.

Primary Examiner—Eugene R. Laroche
Assistant Examiner—Seung Ham
Attorney, Agent, or Firm—William H. F. Howard

[57] ABSTRACT

A phase shifter providing constant group delay and a wide instantaneous bandwidth is taught. In one embodiment, an input port is connected to an output port with a power splitter formed of a transformer connected between the input port and the output port, and having a center tap serving as a sum port. An impedance, such as a resistor, is connected in parallel with the transformer between the input port and the output port. A reactive network is connected between the sum port and ground, including one or more variable reactance device, such as a varactor, which alter the reactance of the reactive network in response to a control signal. Additional reactive elements are included in the reactive network to provide additional poles and zeros which change frequency in response to the variable reactance elements, in order to provide a group delay which is constant for various reactance values provided by the reactive network between the lowest frequency of interest and a higher frequency of interest.

17 Claims, 5 Drawing Sheets

TUNABLE PHASE SHIFTER HAVING WIDE INSTANTANEOUS BANDWIDTH

BACKGROUND

1. Technical Field

This invention pertains to phase shifters, i.e., electronic components capable of altering the phase of an electronic signal.

2. Description of the Prior Art

A phase shifter device is depicted in FIG. 1. Phase shifter 10 includes input port 11 for receiving an input signal, output port 12 for providing an output signal, and control port 13 which receives a control signal which controls the phase of the output signal relative to the input signal. It is often desired to make this phase shift between the output and input signals continuously variable over a wide range, and to allow a wide instantaneous bandwidth. Such phase shifters can thus be used for wideband signals, for example, a QAM digital radio signal.

One embodiment of a prior art phase shifter is shown in FIG. 2. Phase shifter 20 includes circulator 14, which is a three port device. As shown in FIG. 2, the input signal received on input port 11 is provided to varactor diode 15 by circulator 14. The resulting signal reflected off varactor diode 15 is applied to output port 12, and serves as the output signal. Phase control lead 13 receives a DC (or modulating) control signal which is applied to the anode of varactor diode 15, whose cathode is connected to ground. This phase control signal controls the capacitance of varactor diode 15, and thus the phase shift between the output signal on output port 12 and the input signal on input port 11.

One disadvantage of prior art phase shifter 20 of FIG. 2 is that circulators are practical only at microwave frequencies because of the size and magnetic field requirements of ferrite circulators. Furthermore, with a prior art phase shifter as in FIG. 2, delay times change with phase shift, preventing constant group delay.

Another embodiment of a prior art phase shifter is shown in the schematic diagram of FIG. 3. Phase shifter 13 includes quadrature (90°) splitter 16. The input signal is split into two output signals on leads 21 and 22 that reflect back into splitter 16 and emerge from output port 12. Ninety degree phase splitter 12 isolates and impedance matches input port 11 and output port 12. Varactor diodes 17 and 18 are connected between output ports 21 and 22, respectively, of splitter 16, and ground. Varactor diodes 17 and 18 receive a phase control signal from lead 13 which changes their capacitance, and thus the phase shift of the output signal on output port 12. However, quadrature splitters are themselves difficult to design and have poor amplitude and phase matching as compared with in-phase splitters. For example, quadrature splitters measured across a one octave frequency band typically provide output signals within ±3° from quadrature and having 1 dB amplitude balance. 180° hybrid splitters measured across a two decade frequency band typically provide output signals within ±3° and have an amplitude balance of approximately 0.3 db. In contrast, in-phase hybrid phase splitters measured across a two decade frequency band typically provide output signals within ±1° and having amplitude balance of approximately 0.2 db.

Furthermore, VHF quadrature splitters are typically limited to a bandwidth of only one octave. Phase shifters made with quadrature splitters thus require two separate reactive networks, in this case varactor diodes 17 and 18. These reactive networks must be made identical in order to preserve the theoretical input and output port matches at leads 21 and 22.

One notable disadvantage of prior art devices which utilize a single varactor diode capacitor to obtain a variable phase shift is the inability to provide a constant group delay. The diode capacitance is set to give a desired phase shift at one particular frequency. When the signal being phase shifted is more complex than a simple sinusoid, the group delay of the phase shifter over the signal bandwidth is also important. Group delay is the negative of the derivative of the phase with respect to frequency, i.e. the negative of the slope of a phase versus frequency plot. A constant delay (slope) is required in order to prevent the phase shifter from distorting the output signal. An example of such distortion is the introduction of I to Q channel crosstalk on a digital modulation signal. The delay of a single varactor diode reactive network varies as the phase shift is changed. This is apparent from a plot of phase versus frequency for this type of network, as shown in FIG. 4.

For a phase shift of $P_1$ degrees at frequency $W_1$, the capacitance is set to value $C_1$. For a phase shift of $P_2$ degrees at the same frequency $W_1$, the capacitance is set to value $C_2$. The plot shows that the group delay (slope of the plots) for frequencies around $W_1$ varies as the phase shift is changed.

A prior art example of a circuit using a 180° hybrid splitter in a variable reactance network for use in IF stages of FM microwave radio links is described by Shiki et al., "IF Variable Equalizers for FM Microwave Radio Links", *IEEE Transactions on Circuits and Systems*, Vol. CIS-21, No. 4, July 1974, pages 517–527. Shiki et al. describe an equalizer for providing desired shapes of the curve depicting relative time delay versus frequency. Thus, Shiki et al. provide an equalizer circuit for equalizing the group delay of preceding circuit elements so as to provide a desired overall group delay curve, for example an overall group delay which is constant. However, Shiki et al. do not teach or even suggest a phase shifter which itself has a constant group delay.

SUMMARY

In accordance with the teachings of this invention, a phase shifter providing constant group delay and a wide instantaneous bandwidth is taught. In one embodiment, an input port is connected to an output port with a power splitter formed of a transformer connected between the input port and the output port, and having a center tap serving as a sum port. An impedance, such as a resistor, is connected in parallel with the transformer between the input port and the output port. A reactive network is connected between the sum port and ground, including one or more variable reactance devices, such as varactors, which alter the reactance of the reactive network in response to a control signal. Additional reactive elements are included in the reactive network to provide additional poles and zeros which change frequency in response to the variable reactance elements, in order to provide a group delay which is constant for various reactance values provided by the reactive network between the lowest frequency of interest and a higher frequency of interest.

DETAILED DESCRIPTION

In accordance with the teachings of this invention, a novel phase shifter is constructed utilizing a simple in-phase (0°) power splitter, in contrast to the prior which requires use of a quadrature (90°) power splitter, a 180° power splitter, or a circulator. The phase shifter of this invention provides phase shift as determined by a multiple element reactive network, as compared to the single reactive elements (such as a varactor diode) used to control the phase shift in prior art phase shifters. Accordingly, the phase shifter of this invention has enhanced performance as compared with prior art phase shifters. The group delay remains essentially constant even as the phase shift is changed.

Figure 5:
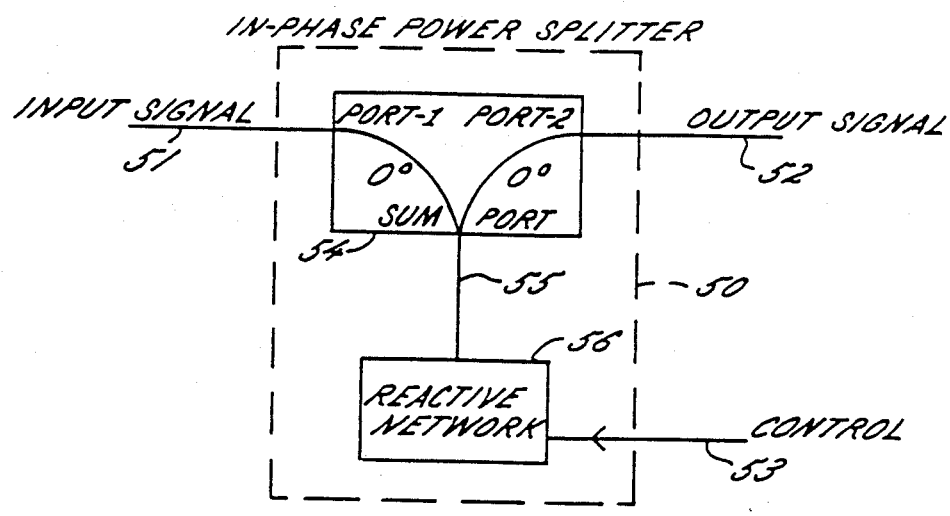
FIG. 5 is a block diagram of a phase shifter constructed in accordance with the teachings of this invention.

One embodiment of a phase shifter constructed in accordance with the teachings of this invention is shown in the schematic diagram of FIG. 5. Phase shifter 50 includes input port 51 and output port 52, each connected to in-phase power splitter 54. Analyzing the operation from the view point of signal flow, the input signal applied to input port 51 exits in-phase power splitter 54 at sum port 55. The signal exiting sum port 55 is completely reflected by reactive network 56 and re-enters in-phase power splitter 54 at sum port 55. This reflected signal which enters sum port 55 exits in-phase power splitter 54 at both input port 51 and output port 52. The signal exiting input port 51 is absorbed by the input signal source (not shown), and the signal exiting output port 52 serves as the output signal.

Thus, the input-to-output transmission path involves a reflection of the input signal at reactive network 56. So long as network 56 is purely reactive, the signal is completely reflected by network 56 and the magnitude of the reflection coefficient is one. The angle of the reflection coefficient of reactive network 56 determines the phase of the reflected signal and thus the phase of the output signal available on output lead 52. The electrical values of the elements forming reactive network 56 are varied to control (i.e. modulate) the phase shift of the output signal available on output lead 52 with respect to the input signal.

Figure 6:
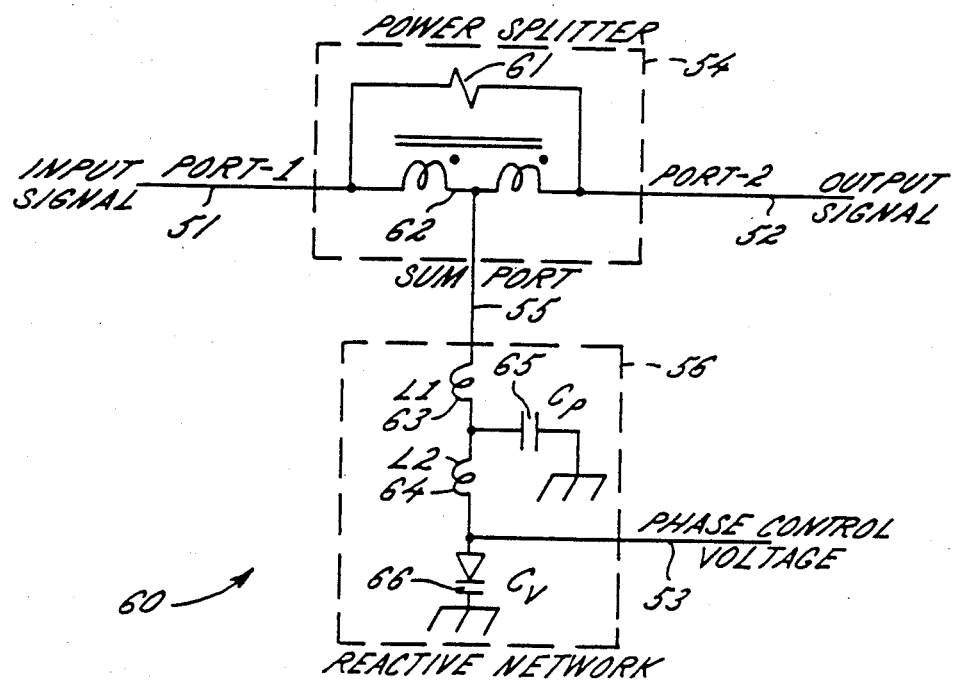
FIG. 6 is a more detailed schematic diagram depicting one embodiment of a phase shifter constructed in accordance with the teachings of this invention.

FIG. 6 is a schematic diagram of one embodiment of this invention. In-phase power splitter 54 includes resistor 61 connected between input lead 51 and output lead 52, and transformer 62 connected between input lead 51 and output lead 52, and having its center tap serving as sum-port 55. Transformer 62 and resistor 61 form a hybrid power splitter. Transformer 62 splits the signal entering sum port 55 that reflects off reactive network 56. Resistor 61 isolates output port 52 from input port 51.

Reactive network 56 includes inductors 63 and 64 connected in series, and capacitor 65 connected between the common node of inductors 63 and 64 and ground. If desired, one or more of inductors 63 and 64 and capacitor 65 are variable, and a wide variety of configurations of additional reactive components can be used. Varactor diode 66 is connected between ground and one side of inductor 64. Phase control lead 53 applies the control or modulating signal voltage to varactor diode 66. If desired, more than one variable reactive elements such as varactors are used in conjunction with more than one control lead, thereby allowing a plurality of control signals to control the phase shift provided by a phase shifter constructed in accordance with the teachings of this invention.

The network comprising inductors 63 and 64, capacitor 65 and varactor diode 66 is reactive and lossless. This causes all of the signal emerging from the splitter sum port 55 to reflect off this network back into sum port 55. That is to say the network has a magnitude of reflection coefficient equal to one. So long as the network is lossless, the signal is totally reflected. This would be true for any lossless network comprising components of any value that might be connected to sum port 55. However, in accordance with the teachings of this invention, we are interested in the angle of the reflected signal, since the transmitted signal from input port 51 to output port 52 follows the path from input port 51 to sum port 55, total reflection, and thence from sum port 55 to output port 52. Thus, the phase shift from input to output equals the phase angle of the reflection coefficient of reactive network 60 which is determined by its topology and element values. In terms of scattering parameters (S-parameters) and reflection coefficient gamms ($\Gamma$)

$$\angle S21 = \angle \Gamma_N; \text{ where} \tag{1}$$

$\angle S21 = $ the angle of the output signal relative to the input signal; and $\angle \Gamma_N = $ the angle of the reflection coefficient seen looking into the reactive network 60.

Using the well known formula relating reflection coefficient $\Gamma$ to system characteristic impedance $Z_O$ and load impedance $Z_L$ $$\Gamma = \frac{Z_L - Z_0}{Z_L + Z_0} \tag{2}$$

or in our case more specifically $$\Gamma_N = \frac{Z_N - Z_0}{Z_N + Z_0}; \text{ where} \quad (3)$$

$\Gamma_N$ = the reflection coefficient looking into reactive network 60;

$Z_N$ = the impedance seen looking into reactive network 60; and $Z_0$ = the impedance seen looking back into splitter sum port 55.

$\Gamma_N$ can be expressed as a product of zeros in the numerator and a product of poles in the denominator:

$$\Gamma_N = \frac{\prod_{i=1}^{M}(s - z_i)}{\prod_{j=1}^{N}(s - p_j)} \quad (4)$$

For a lossless network made of reactive components having real values, the poles are in the left half plane and the zeros are in the right half plane. In fact, the zeros form a mirror image of the poles as reflected around the imaginary axis. This insures a magnitude of reflection coefficient equal to unity.

What remains is to properly place the poles and zeros to achieve the desired angle of reflection coefficient.

We first examine the shortcomings of prior art single reactive element phase shifters in terms of the poles and zeros of $\Gamma_N$. Then we show the improvement gained by using one specific network of the types of networks taught by this invention.

Figure 1:
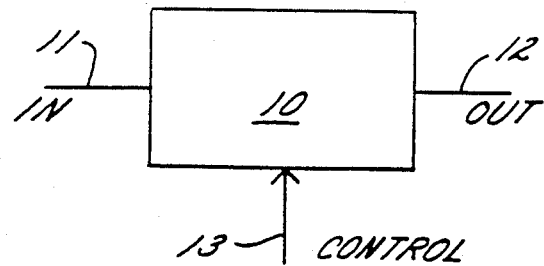
FIG. 1 is a block diagram of a typical prior art phase shifter.
Figure 2:
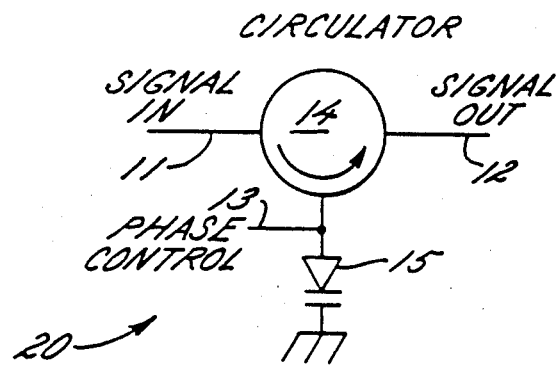
FIG. 2 is a diagram of a typical prior art phase shifter which utilizes a circulator.
Figure 3:
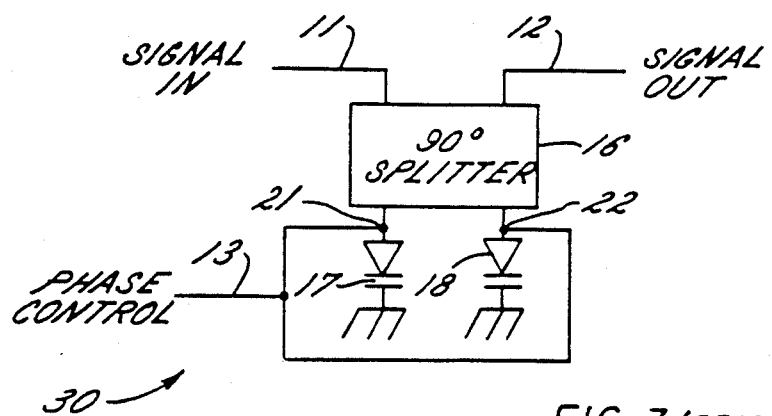
FIG. 3 is a block diagram of a typical prior art phase shifter which utilizes a quadrature splitter.
Figure 8:
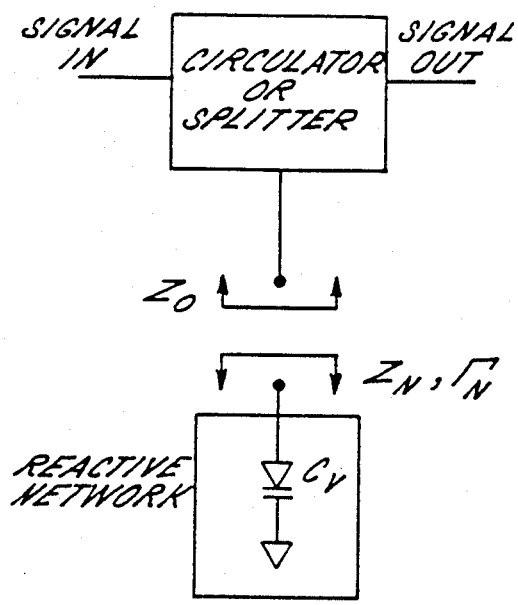
FIG. 8 is a model of a prior art phase shifter such as shown in FIGS. 2 and 3 which is useful for purposes of analysis.

Let the single reactive element be a capacitance of value $C_v$ as represented by the varactor diode in FIG. 2. (In FIG. 3, the two varactor diodes yield a phase shift as if they were one reactive element due to the nature of the quadrature splitter. They do not operate as a multiple element network for the sake of determining the angle of $\Gamma_N$.) FIG. 8 is the model for the following analysis. Applying equation (3) and its definitions of terms to FIG. 8

$$\Gamma_N = \frac{Z_N - Z_0}{Z_N + Z_0} \quad (5)$$

Let $Z_0$ be a resistance of value R. Substituting and using Laplace transforms $$\Gamma_N(s) = \frac{\frac{1}{sC_v} - R}{\frac{1}{sC_v} + R} \quad (6)$$

Where $Z_N$ is the impedance of capacitance $C_v$:

$$Z_N = \frac{1}{sC_v} \quad (7)$$

Rearranging we get $$\Gamma_N(s) = \frac{s - \frac{1}{RC_v}}{s + \frac{1}{RC_v}} \quad (8)$$

Thus, $\Gamma_N(s)$ has a pole at s $$-\frac{1}{RC_v}$$

and a zero at s $$\frac{1}{RC_v}.$$

Figure 9:
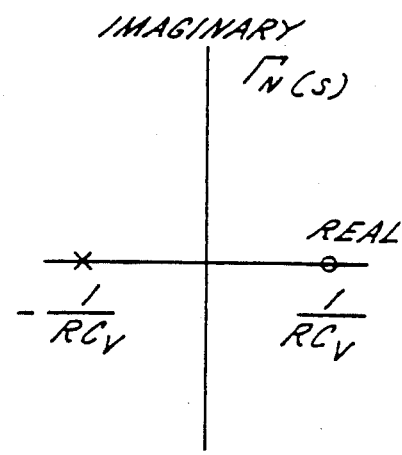
FIG. 9 is an s-plane plot of the pole and zero of the reflection coefficient $\Gamma_N$ of FIG. 8.

These are shown plotted in the $\Gamma_N$ s-plane in FIG. 9.

Since we are interested in the angle of $\Gamma_N(s)$ for sinusoidal signals, we let $s=jW$.

Figure 4:
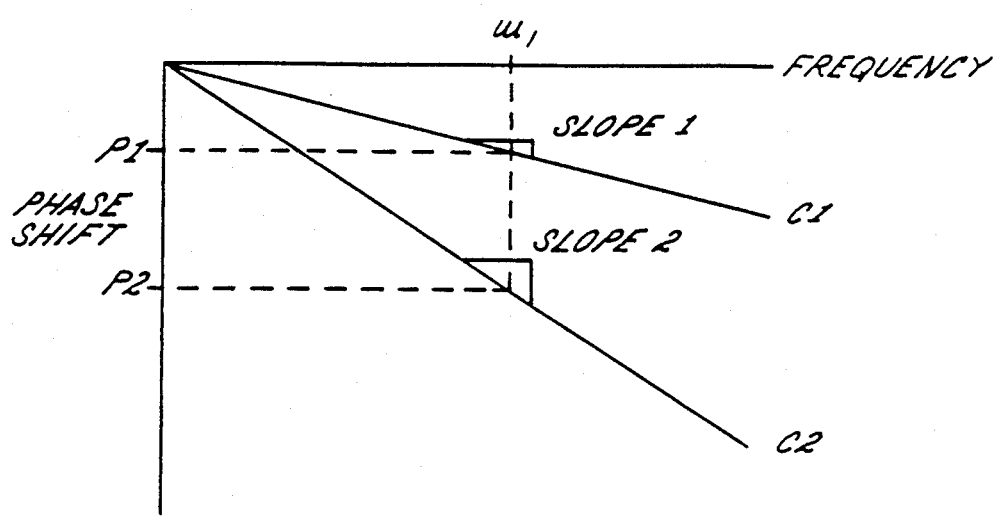
FIG. 4 is a plot depicting phase shift versus frequency for a typical prior art phase shifter.
Figures 10A, 10B:
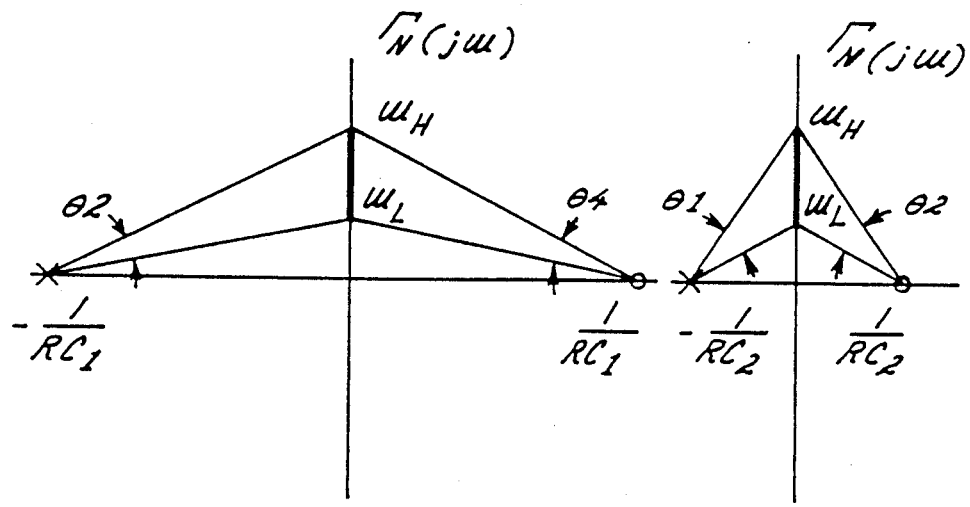
FIGS. 10a and 10b are s-plane plots of the pole and zero of $\Gamma_N$ of FIG. 8 for two separate capacitor values over a range of frequencies from $W_L$ to $W_H$.

We make this substitution in FIGS. 10a and 10b, where we show the pole and zero locations for two different values of $C_v$, $C_v=C_1$ and $C_v=C_2$. $C_1$ represents a small capacitance and $C_2$ a larger capacitance. We are interested in the angle of $\Gamma_N$ over the sinusoidal frequency range from some lower frequency $W_L$ to some higher frequency $W_H$. Actually, we are interested in the change of the angle of $\Gamma_N$ with respect to frequency because that is the group delay that we require to be constant. In FIG. 10b, we see that when $C_v$ has value $C_2$ the angle of $\Gamma_N(jW)$ changes by $\theta_2+\theta_2$ as W ranges from $W_L$ to $W_H$, and when $C_v$ has value $C_1$, the angle changes by $\theta_2+\theta_4$. Since $\theta_2+\theta_4$ is greater than $\theta_1+\theta_2$, the change of angle is not constant for the two values of $C_v$. The group delay is not constant for different signal phase shifts of the phase shifter apparatus. This condition corresponds to that depicted in FIG. 4.

Multiple element reactive networks will have pole zero diagrams that are different from those shown in FIGS. 10a and 10b. By properly placing the poles and zeros and their movements as the component values are changed, an essentially constant group delay can be maintained even as the phase shift is varied. The embodiment shown in FIG. 6 can have these properties. However, both the network topology and the component values must be correct to give the necessary pole zero locations and trajectories as a function of element values.

Figure 11A:
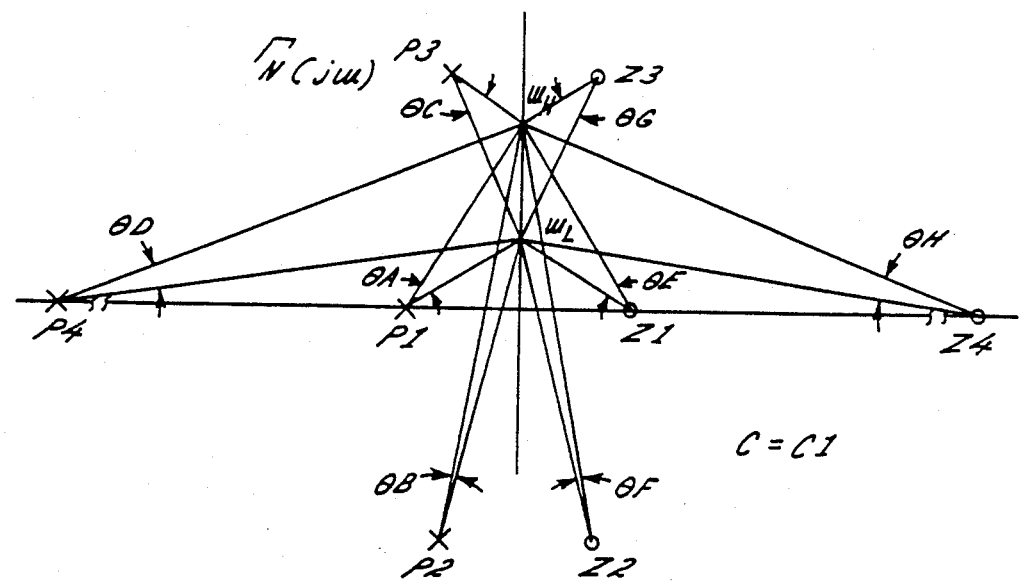
FIGS. 11a and 11b are pole-zero plots of $\Gamma_N$ of the reactive network for the embodiment of this invention shown in FIG. 6 for two capacitance values of the variable capacitance $C_v$ over a range of frequencies from $W_L$ to $W_H$.
Figure 11B:
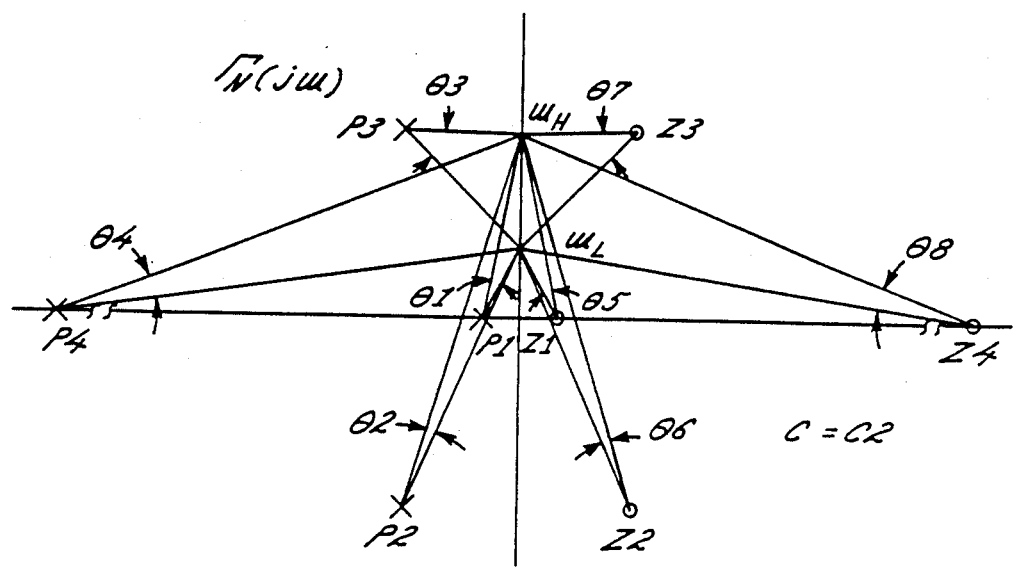

$\Gamma_N$ for the reactive network of FIG. 6 has four left half s-plane poles and four right half s-plane zeros. They are plotted and labeled P1 through P4 and Z1 through Z4, respectively, in FIGS. 11a and 11b. In FIG. 11a, the angle of $\Gamma_N(jW)$ changes by $\theta_A+\theta_B+\theta_C+\theta_D+\theta_E+\theta_F+\theta_G+\theta_H$ as W ranges from $W_L$ to $W_H$ when $C_v$ has value $C_1$. In FIG. 11b, this angle changes by $\theta_1+\theta_2+\theta_3+\theta_4+\theta_5+\theta_6+\theta_7+\theta_8$ as W ranges from $W_L$ to $W_H$ when $C_v$ has value $C_2$. We require that these two sums-of-angles be equal, in order to have constant group delay. It is not necessary that the individual angles remain constant, only that their sums remain equal as $C_v$ is varied. The sum does remain constant because the entire constellation of poles an zeros changes as a function of the value of $C_v$ in FIG. 6. The entire constellation changes because of the appearance of $C_v$ in the various terms of the equation for $\Gamma_N$.

$$\Gamma_N(s) = \frac{C_v C_p L_1 L_2 s^4 - C_v C_p L_2 R s^3 + (C_v L_2 + C_v L_1 + C_p L_1) s^2 - (C_v + C_p) R s + 1}{C_v C_p L_1 L_2 s^4 + C_v C_p L_2 R s^3 + (C_v L_2 + C_v L_1 + C_p L_1) s^2 + (C_v + C_p) R s + 1} \quad (9)$$

Figure 7:
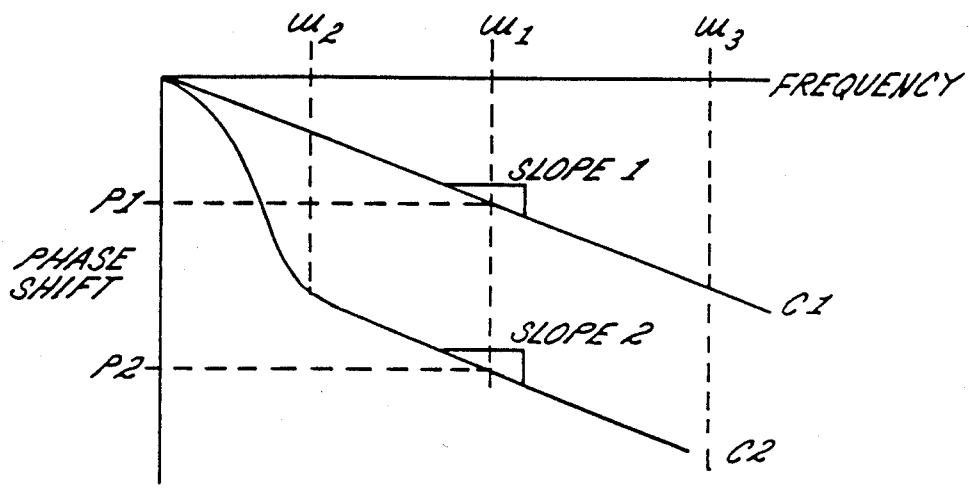
FIG. 7 is a plot of phase shift versus frequency of one embodiment of a phase shifter constructed in accordance with the teachings of this invention.

As one example of this, as $C_v$ is varied from $C_1$ to $C_2$, the angle associated with $P_3$ increases while the angle associated with $P_1$ decreases. And over the frequency range $W_L$ to $W_H$ the changes cancel each other. This performance corresponds to that depicted in FIG. 7, where the group delay (slope) remains constant between $W_L = W_2$ and $W_H = W_3$ even as the signal phase shift is changed. In one embodiment $F_L = (2\pi W_L)$ is approximately 40 MHz and $F_H = (2\pi W_H)$ is approximately 100 MHz.

DESIGN TECHNIQUE

(1) Create pole zero diagram.

Create a pole zero diagram for $\Gamma_N(s)$ that gives the required phase shift range consistent with permissible group delay variation from a constant value. Since the reflecting network is purely reactive and must therefore have magnitude of $\Gamma_N(s)$ equal to one for all real frequencies W, it becomes a given that the zeros of $\Gamma_N(s)$ will be mirror image of the poles of $\Gamma_N(s)$ as reflected about the imaginary axis.

The four element reactive ladder network in FIG. 6 is a particularly practical and useful embodiment. This network has $\Gamma_N(s)$ given by equation (9). Equation (9) indicates that the pole zero diagram will change as a function of $C_v$. Computer optimization shows that the pole zero movement depicted in FIGS. 11a and 11b results in minimum group delay variation, even though only one of the four elements ($C_v$) must be a variable component.

For a normalized design center frequency of $$W_0 = \sqrt{W_H \times W_L} = 1, \quad (10)$$

the computed pole zero locations of $\Gamma_N(s)$ for this network are

| | |
|---|---|
| $P_1 = -0.612$ | $Z_1 = 0.612$ |
| $P_2 = -0.887 - 1.96j$ | $Z_2 = 0.887 - 1.96j$ |
| $P_3 = -0.887 + 1.96j$ | $Z_3 = 0.887 + 1.96j$ |
| $P_4 = -10.1$ | $Z_4 = 10.1$ |

(2) Find $Z_N(s)$.

From equation (3) we have $$\Gamma_N = \frac{Z_N - Z_0}{Z_N + Z_0} \text{ which can be solved for } Z_N$$

which can be solved for $Z_N$ $$Z_N = Z_0 \frac{1 + \Gamma_N}{1 - \Gamma_N} \quad (11)$$

Let $Z_O = 1$ ohm to yield a design normalized to the 1 ohm impedance level.

(3) Synthesize $Z_N(s)$.

Synthesize $Z_N(s)$ as a driving point impedance using a standard technique such as partial fraction expansion to get the element values for the ladder network. Such techniques are well known to those of ordinary skill in the art and are described, for example, by Weinberg, "Network Analysis and Synthesis", Chapter 10: "Realization of General Driving-Point Functions," McGraw Hill, 1962, pages 422 et. seq.

This results in a network normalized to a center frequency $W_O = 1$ and an impedance level of 1 ohm. The element values are, referring to reactive network 56 of FIG. 6:

$L_1 = 0.080$ Henrys
$L_2 = 0.54$ Henrys
$C_p = 0.50$ Farads
$C_v = 1.6$ Farads

(4) Scale to desired frequency and impedance.

Frequency and impedance scale the values of components $L_1$, $L_2$, $C_p$ and $C_v$ to the desired application. Sample calculation:

$F_O = 70$ MHz
$Z_O = 50 \Omega$ $$W_O = 2\pi F_O = (2\pi)(70 \times 10^6)$$

Scale $L_1$ to:

$$0.54 \text{ H} \times \frac{50\Omega}{1\Omega} \times \frac{1}{(2\pi)(70 \times 10^6)} = 62 \text{ nH}$$

Scale $L_2$ to:

$$0.080 \text{ H} \times \frac{50\Omega}{1\Omega} \times \frac{1}{(2\pi)(70 \times 10^6)} = 9.1 \text{ nH}$$

Scale $C_p$ to:

$$0.50 \text{ F} \times \frac{1\Omega}{50\Omega} \times \frac{1}{(2\pi)(70 \times 10^6)} = 23 \text{ pF}$$

Scale $C_v$ to:

$$1.6 \text{ F} \times \frac{1\Omega}{50\Omega} \times \frac{1}{(2\pi)(70 \times 10^6)} = 73 \text{ pF}$$

$C_v$ is provided by variable capacitance diode 66 in FIG. 6. The value of $C_v$ determines the phase shift. For values of $C_v$ from $\frac{1}{2}$ to 2.5 times the value given by the calculation for $W_O$, the phase shift changes by approximately 90°. That is to say, a 5:1 change of $C_v$ will produce a 90° change in phase of the signal passing through phase shifter 50 of FIG. 6.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A phase shifter comprising:
   an input port for receiving an input signal within a range of frequencies between a first frequency and a second frequency greater than said first frequency;
   an output port for providing an output signal in response to said input signal, said output signal being shifted in phase from said input signal;
   a power splitter having an input port connected to said input port of said phase shifter, an output port connected to said output port of said phase shifter, and a sum port; and
   a reactive network comprising:
   an input/output port connected to said sum port of said power splitter;
   a control lead for receiving a control input signal indicative of the desired phase shift of said output signal relative to said input signal;
   means for providing one or more variable reactances, the reactance of said variable reactances being determined in response to said control input signal, each of said variable reactances providing an associated pole and zero;
   means for providing one or more poles of the reflection coefficient of said reactive network in addition to said poles provided by said one or more variable reactances; and
   means for providing one or more zeros of the reflection coefficient of said reactive network in addition to said zeros provided by said one or more variable reactances,
   wherein said one or more poles and said one or more zeros move over frequency in a manner such that the effect of said one or more variable reactances, said one or more poles, and said one or more zeros track over frequency to provide a substantially constant group delay between said output and said input signals.

2. A phase shifter as in claim 1 wherein said power splitter comprises a hybrid power splitter.

3. A phase shifter as in claim 2 wherein said power splitter comprises a 0 degree splitter.

4. A phase shifter as in claim 1 wherein said power splitter comprises a transformer having an input port connected to said input port of said power splitter, an output port connected to said output port of said power splitter, and a center tap port connected to said sum port of said power splitter.

5. A phase shifter as in claim 4 wherein said power splitter further comprises an impedance connected between said input port of said power splitter and said output port of said power splitter.

6. A phase shifter as in claim 5 wherein said impedance serves to isolate said output port of said power splitter from said input port of said power splitter.

7. A phase shifter as in claim 5 wherein said impedance comprises a resistor.

8. A phase shifter as in claim 1 wherein said means for providing a variable reactance comprises a varactor diode.

9. A phase shifter as in claim 8 wherein said varactor diode is connected to said control lead.

10. A phase shifter as in claim 9 wherein said control lead is connected to the anode of said varactor diode.

11. A phase shifter as in claim 9 wherein said control lead is connected to the cathode of said varactor diode.

12. A phase shifter as in claim 1 wherein said means for providing one or more poles comprises a network of multiple reactive elements.

13. A phase shifter as in claim 1 wherein said means for providing one or more zeros comprises a network of multiple reactive elements.

14. A phase shifter as in claim 12 wherein said multiple reactive elements comprise one or more variable reactive elements.

15. A phase shifter as in claim 13 wherein said multiple reactive elements comprise one or more variable reactive elements.

16. A phase shifter as in claim 1 which comprises a plurality of control leads for receiving control signals indicative of the desired phase shift of said output signal relative to said input signal, and said means for providing one or more variable reactances comprise a plurality of variable reactances, each associated with one of said control leads.

17. A phase shifter as in claim 1 wherein said sum port comprises a single lead referenced to ground.

* * * * *